(12) United States Patent
Eberlein et al.

(10) Patent No.: US 11,012,095 B2
(45) Date of Patent: May 18, 2021

(54) METHOD FOR PROTECTION OF SIGNAL BLOCKAGES IN A SATELLITE MOBILE BROADCAST SYSTEM

(71) Applicants: EUTELSAT S A, Paris (FR); Ernst Eberlein, Grossenseebach (DE); Antonio Arcidiacono, Paris (FR); Daniele Vito Finocchiaro, Paris (FR)

(72) Inventors: Ernst Eberlein, Grossenseebach (DE); Antonio Arcidiacono, Paris (FR); Daniele Vito Finocchiaro, Paris (FR)

(73) Assignee: EUTELSAT S A, Paris (FR)

( * ) Notice: Subject to any disclaimer, the term of this patent is extended or adjusted under 35 U.S.C. 154(b) by 56 days.

(21) Appl. No.: 16/474,932

(22) PCT Filed: Dec. 29, 2017

(86) PCT No.: PCT/EP2017/084802
§ 371 (c)(1),
(2) Date: Jun. 28, 2019

(87) PCT Pub. No.: WO2018/122369
PCT Pub. Date: Jul. 5, 2018

(65) Prior Publication Data
US 2019/0349075 A1     Nov. 14, 2019

(30) Foreign Application Priority Data

Dec. 30, 2016   (EP) ..................................... 16207502

(51) Int. Cl.
*H03M 13/27*     (2006.01)
*H04B 7/185*     (2006.01)
*H04W 16/08*     (2009.01)

(52) U.S. Cl.
CPC .... *H03M 13/2792* (2013.01); *H03M 13/2732* (2013.01); *H04B 7/18517* (2013.01); *H04B 7/18523* (2013.01); *H04W 16/08* (2013.01)

(58) Field of Classification Search
CPC .......... H04B 7/18523; H03M 13/2792; H03M 13/6541; H03M 13/6552; H03M 13/6555
See application file for complete search history.

(56) References Cited

U.S. PATENT DOCUMENTS

| 5,287,351 A * | 2/1994 | Wall, Jr. ............. H04B 7/18523 370/206 |
| 7,532,857 B2 * | 5/2009 | Simon .................... H04H 20/22 370/276 |

(Continued)

FOREIGN PATENT DOCUMENTS

| EP | 0 855 840 A1 | 7/1998 |
| EP | 2 782 280 A1 | 9/2014 |

OTHER PUBLICATIONS

International Search Report as issued in International Patent Application No. PCT/EP2017/084802, dated Feb. 5, 2018.

*Primary Examiner* — Steve N Nguyen
(74) *Attorney, Agent, or Firm* — Pillsbury Winthrop Shaw Pittman LLP

(57) ABSTRACT

A method of generating interleaved symbols in a multiplexed data steam for a satellite broadcasting application to a plurality of receivers, includes allocating a plurality of data programs to a plurality of primary multiplexers according to a load balancing scheme; encoding in each primary multiplexer a plurality of data programs according to a coding scheme at a predefined code rate for generating encoded frames; and generating super frames in each primary multiplexer.

16 Claims, 4 Drawing Sheets

(56) References Cited

U.S. PATENT DOCUMENTS

| | | | | |
|---|---|---|---|---|
| 7,764,608 B2* | 7/2010 | Breynaert | ........... | H04N 21/4382 |
| | | | | 370/230 |
| 8,503,551 B2* | 8/2013 | Ko | ........... | H04H 20/00 |
| | | | | 375/260 |
| 9,729,174 B2* | 8/2017 | Myung | ........... | H03M 13/2792 |
| 2008/0212599 A1* | 9/2008 | Chen | ........... | H04N 21/2662 |
| | | | | 370/411 |
| 2009/0034442 A1* | 2/2009 | Song | ........... | H04N 21/4382 |
| | | | | 370/310 |
| 2009/0125780 A1* | 5/2009 | Taylor | ........... | H03M 13/2906 |
| | | | | 714/752 |
| 2009/0175349 A1* | 7/2009 | Ye | ........... | H04N 19/70 |
| | | | | 375/240.23 |
| 2011/0219279 A1* | 9/2011 | Abu-Surra | ........ | H03M 13/2906 |
| | | | | 714/746 |
| 2013/0166992 A1* | 6/2013 | Shinohara | ........ | H03M 13/6552 |
| | | | | 714/766 |
| 2014/0119473 A1* | 5/2014 | Breiling | ........... | H04L 1/0071 |
| | | | | 375/295 |
| 2015/0358034 A1 | 12/2015 | Baek et al. | | |
| 2016/0218823 A1 | 7/2016 | Baek et al. | | |

* cited by examiner

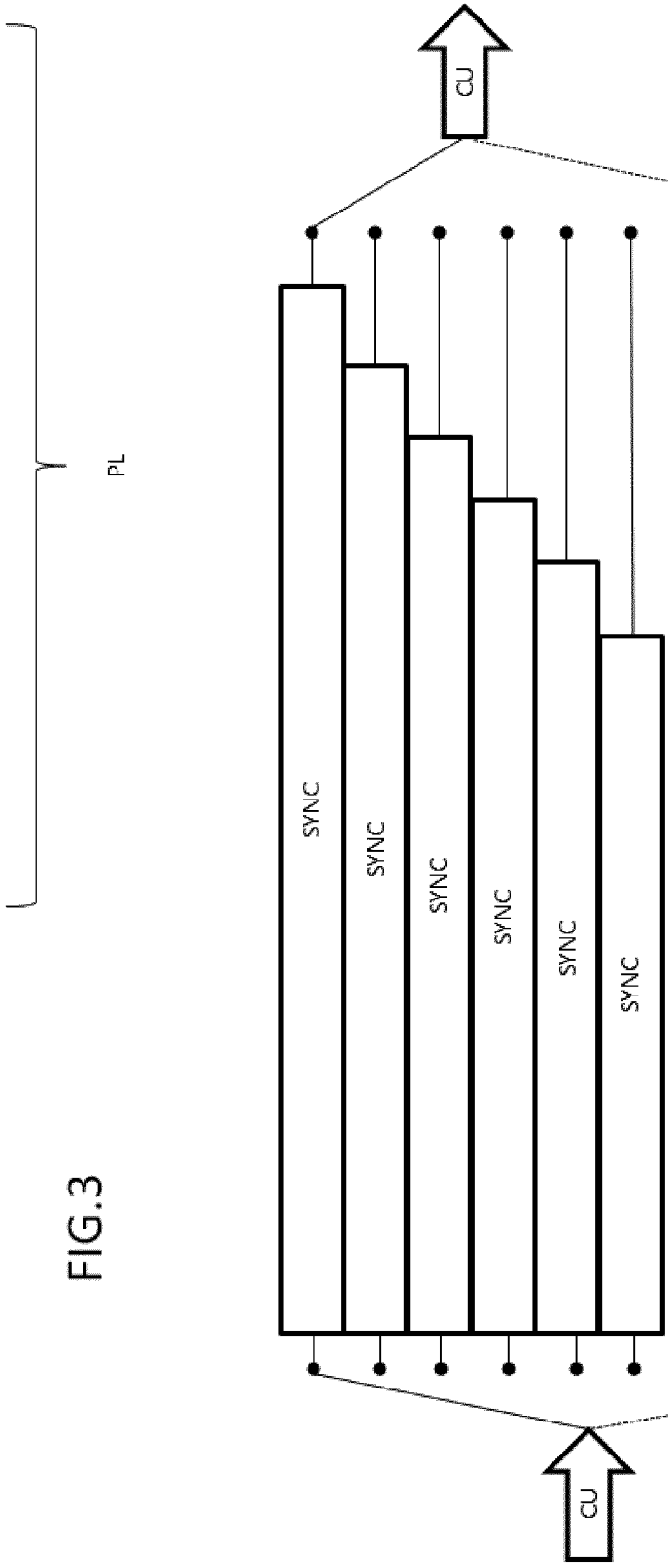
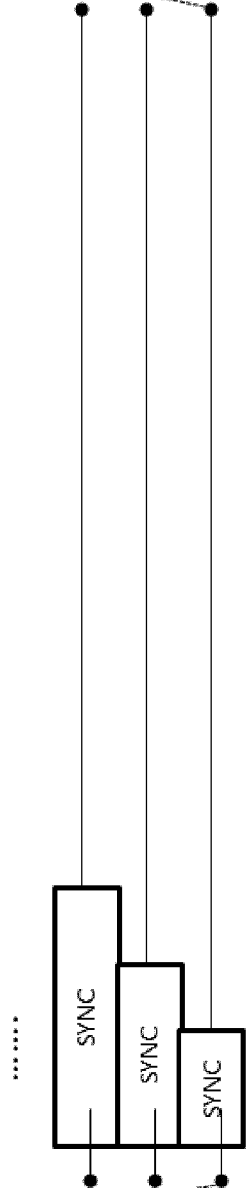

METHOD FOR PROTECTION OF SIGNAL BLOCKAGES IN A SATELLITE MOBILE BROADCAST SYSTEM

CROSS REFERENCE TO RELATED APPLICATIONS

This application is the U.S. National Stage of PCT/EP2017/084802, filed Dec. 29, 2017, which in turn claims priority to European Patent Application No. 16207502.2 filed Dec. 30, 2016, the entire contents of all applications are incorporated herein by reference in their entireties.

TECHNICAL FIELD

The technical field of the invention is directed to methods for generating data frames into a broadcasting protocol through satellite communications. The technical field relates to a broadcasting protocol for a plurality of mobile receivers such as cars. The invention relates more particularly to a method able to protect a signal from blockages occurring due to obstacles during movement of a mobile receiver. The technical field of the invention is also related to systems allowing the encoding and the multiplexing of a plurality of program data.

RELATED ART

A broadcast transmission scheme usually involves a transmission of a plurality of signals implemented by a Hub on a base station on earth. The emitted signals from the Hub are addressed to a broadcast satellite which receives, amplifies and relays the signals on an area on earth that is covered by the satellite antenna. In order to optimize the broadcast transmission, the orientation and the gain of the antenna of the satellite is predefined for covering an area in which the signals, for instance programs data, are received in good conditions.

In satellite transmissions, the receivers are usually in a fixed position in line-of-sight with the satellite. A specific antenna configuration (orientation, gain, etc.), e.g. on the roof of a house, provides a good connection with the satellite in order to limit data losses.

It exists a need to deploy a broadcast protocol for mobile receivers. An example application is to deliver television and radio signals to cars, buses and trucks. One main problem raised in such reception environment, is that the delivered signal from the satellite may suffer of obstacles blocking the line-of-sight between the satellite and a terminal.

At the receiver level, a reception scenario may be defined by one of the following states:
- a line-of-sight link with the satellite, this is referred to as "line-of-sight state" (LOS);
- an attenuation of the signals received, for example by trees, wall, etc. This state often is referred to as "shadow state";
- a blockage state, when the signal is completely blocked or attenuated so heavily that it is no longer useful.

Depending on the movement of receivers and/or objects imparing the reception paths and depending on the nature of the surroundings of receivers, reception errors may occurs at different levels. The reception paths may be blocked, or shadowed, during a certain period due to this receiving context. When the blockage period of transmission is very short, some error correcting algorithms may be implemented at the emitter and at the receiver levels for recovering the full signal in reception. When the blockage period of transmission is long, error correcting algorithms become very complex, if no complementary technologies are introduced. A perfect error correcting codes (FEC) allows that up to the amount of data added as redundancy can be lost by blockages. An error free communication is only possible if for all time intervals this criteria is fulfilled. For long blockage events FEC schemes with very long code words would be required. Beside complexity this may also result in a high latency.

In order to solve partially this problem, some techniques include the use of optimized FEC schemes together with time interleaving processing. It is the objective of an interleaver to distribute the data in time so that the time varying channel properties becomes approximately constant on average after the de-interleaving operation, so that error correcting codes can be successfully applied. For example, a long blockage on the interleaved data becomes, after de-interleaving, many short blockages, equivalent to the effect of shadowing. If appropriately dimensioned, the use of interleaver and FEC allows recovering at the receiver data losses due to blockages.

The channel state which corresponds to the quality of the signal in reception may change slowly when signal properties are correlated with the surroundings, for example when the reception is made by a moving car. In comparison the change due to the multipath propagation's effects may change quickly and may be treated with a different (compared to the duration of the blockage short) interleaving length.

Different interleavers may be designed to meet different needs in reception. Among these interleaving techniques, some of them are already part of existing standards, in particular DVB-SH, ESDR, and DVB-NGH. But these techniques are not compatible with the common standards used for broadcasting from satellites at Ku- and Ka-band as for example the DVB-S2 standard.

It exists a need of a solution allowing the combination of traditional satellite applications concentrating on roof-top reception with applications targeting mobile receptions. Furthermore different mobile reception scenarios exist and it shall be possible to parameterize the system for different so-called LMS channel conditions, LMS designating "Land Mobile Satellite". The impact to user equipment used for legacy satellite broadcasting applications, in particular DVB-S2 chipsets, shall be small. The solution should be partly compatible to the latest versions of the DVB-S2 standard, also called DVB-S2X.

Moreover, for mobile reception the use of smaller antennas shall be supported. At the same time terminals using better antennas shall receive the signal with a better quality of service QoS. It is even of interest to multiplex different applications targeting different types of receiver into one single signal.

The purpose of the present invention is to achieve optimal performances, while reusing the existing DVB-S2 standard. An extension of the DVB-S2X standard is proposed. The extension has a low impact on a hub transmitter and the chipsets used for the receivers. The solution is partly backward compatible to the latest DVB-S2X standard. Receivers not supporting the extension can at least receive the signals targeting traditional satellite application assuming LOS reception. The invention allows the deployment of a solution adapted to a broadcasting protocol solution based on DVB-S2 protocol for a plurality of mobiles receivers and/or fixed receivers.

SUMMARY OF THE INVENTION

The invention allows to overcome these drawbacks.

According to one aspect of the invention, a method of generating interleaved symbols in a multiplexed data steam for a satellite broadcasting application to a plurality of receivers, comprises:

allocating a plurality of data programs to a plurality of primary multiplexers according to a load balancing scheme;
  encoding in each primary multiplexer a plurality of data programs according to a coding scheme at a predefined code rate for generating encoded frames;
  generating super frames in each primary multiplexer by:
    performing symbols generation by applying a symbol mapping function to the previously encoded frames;
    time interleaving symbols according to a convolutional interleaving scheme by:
      dispersing a predefined number of symbols by considering blocks of symbols, called capacity unit, into a sliding time window, the length of the time window being defined by a interleaver length;
      generating at least a header for each super frame (SF) comprising at a synchronization indicator and an indicator of the format of the super frame defining if the said super frame includes interleaver or non-interleaved data;
      organizing payload of the super frame by considering a predefined set of interleaved symbols;
  multiplexing a set of super frames issued from a plurality of primary multiplexers into a carrier signal.

According to one embodiment, the load balancing scheme ensures sensibly the same bit rate at the output of each primary multiplexer, the load balancing scheme distributing data programs in the different primary multiplexers taking into account each program bit rate.

According to one embodiment, the FEC scheme comprises a LDPC coder with or without additional BCH coder.

According to one embodiment, the FEC scheme comprises a mixer interleaving encoded bits of the multiplexed data programs, the mixing operation being realized by separating the encoded bits stream into blocks of bits and mixing bits inside each block.

According to one embodiment, the header of the super frame comprises an identifier field indicating the presence or not of time interleaved data in the payload of the said super frame.

According to one embodiment, the header of the super frame comprises a reserved field indicating the value of transmit parameters of which at least an interleaver profile and/or an interleaver length.

According to one embodiment, the reserved field (MFH) indicates the code rate of the FEC scheme.

According to one embodiment, the interleaver profile comprises:

a length of capacity unit;
  a number of capacity units used in the interleaving process.

According to one embodiment, the super frames generated by a primary multiplexer share the same interleaver profile, the load balancing scheme taking into account the interleaver profile in the programs distribution in the each primary multiplexer.

According to one embodiment, the interleaver length defines an interleaver entity and the size of the time window.

According to one embodiment, the interleaver length is equal or greater than the super frame length.

According to one embodiment, the header of the super frame comprises an synchronization field indicating the beginning of a super frame.

According to one embodiment, the dispersing operation is synchronized with the synchronization field.

According to one embodiment, the step of organizing payload of super frame comprises the generation of a plurality of payload frames including each a predefined number of capacity units, each super frame comprising interleaved symbols distributed over the plurality of payload frames.

According to one embodiment, the carrier signal is generated into one of the following band: Ka-band, Ku-Band, L-band, C-band or S-band.

According to another aspect of the invention, a signal processing system for generating interleaved symbols for a satellite broadcasting application comprises a plurality of primary multiplexers, a load balancing system configured for allocating data programs in the different primary multiplexer so that the output bit rates of each multiplexer occupies several super frames in a time period according to the effective time interleaver length, each multiplexer comprising a primary calculator for processing the following steps:

encoding and mixing bits of a multiplexed data stream and;
  generating symbols by applying a symbol mapping function to the previous encoded frames, the symbol mapping function being stored in a physical memory of the signal processing system;
  processing time interleaving symbols with a predefined interleaver profile and with a interleaver length;
  generating super frames (SF) by:
    inserting signaling data comprising the indication or not of interleaved data in the payload of each super frame;
    organizing the payload of each super frame, each multiplexer comprising a primary physical memory for storing a set of symbols which are temporally stored in a convolutional interleaving processing, the physical memory being organized in a set of registers allowing spreading the symbols over a sliding time window, the system comprising a final multiplexer for multiplexing the super frames generated in each primary multiplexer.

According to one example, each multiplexer occupies typically at least 10 super frames in a time period according to the effective time interleaver length.

According to another aspect of the invention, a receiver for receiving a carrier signal multiplexed by the method of the invention comprises a calculator for de-multiplexing the carrier signal, analyzing each header of the received super frames and de-interleaving the symbols of the payload of at least one super frame by applying the transmit parameters of the header related to the interleaver length and the interleaver profile.

According to one embodiment, the receiver comprises a calculator for:

extracting the interleaver length of a received super frame;
  reserving a memory capacity of the receiver corresponding to the interleaver length for storing the received symbols of at least one decoded super frame, the data stored forming an interleaver entity;
  de-interleaving the symbols of the interleaver entity.

BRIEF DESCRIPTION OF THE DRAWING

Further features and advantages of the invention will become evident upon reading the following detailed description with reference to the accompanying drawing, in which:

FIG. 3 shows a super frame structure according to the invention;

FIG. 4 shows a convolutional interleaver mechanism according to one implementation of the invention;

DESCRIPTION

The invention relates to a signal processing system 1 for satellite broadcasting and to a method for generating and receiving such signals.

Figure 1:
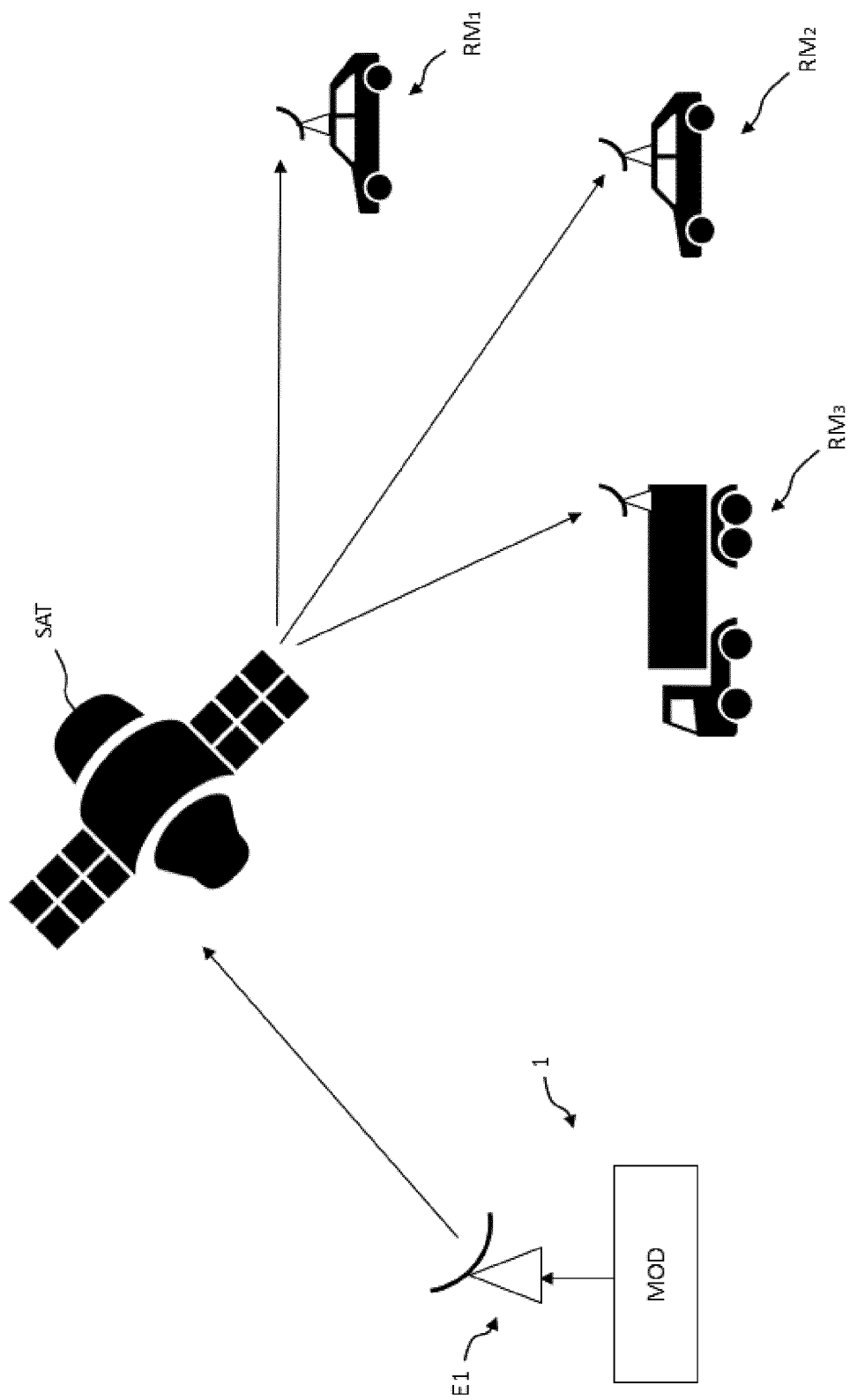
FIG. 1 shows a satellite broadcasting scheme where a signal processing system and a plurality of mobiles receivers are represented.

FIG. 1 shows such signal processing system 1, also called a hub. The signal processing system 1 comprises at least a modulator MOD and an emitter E1. The processed signals are emitted toward a satellite SAT for the broadcast completion on an area on earth. FIG. 1 shows a plurality of mobile receivers represented by car(s) or truck(s) and noted $RM_1$, $RM_2$, $RM_3$. The mobile receivers may be in movement during the reception of signals.

The invention allows solving the case where at least a mobile is not in the line of sight, or others similar cases, of the satellite during several seconds and some consecutive blocks of transmitted data are not received by the mobile. The method of the invention allows recovering the full data contained in the signal which is broadcast by the satellite in a sufficient period of time.

Multiplexers

Figure 2:
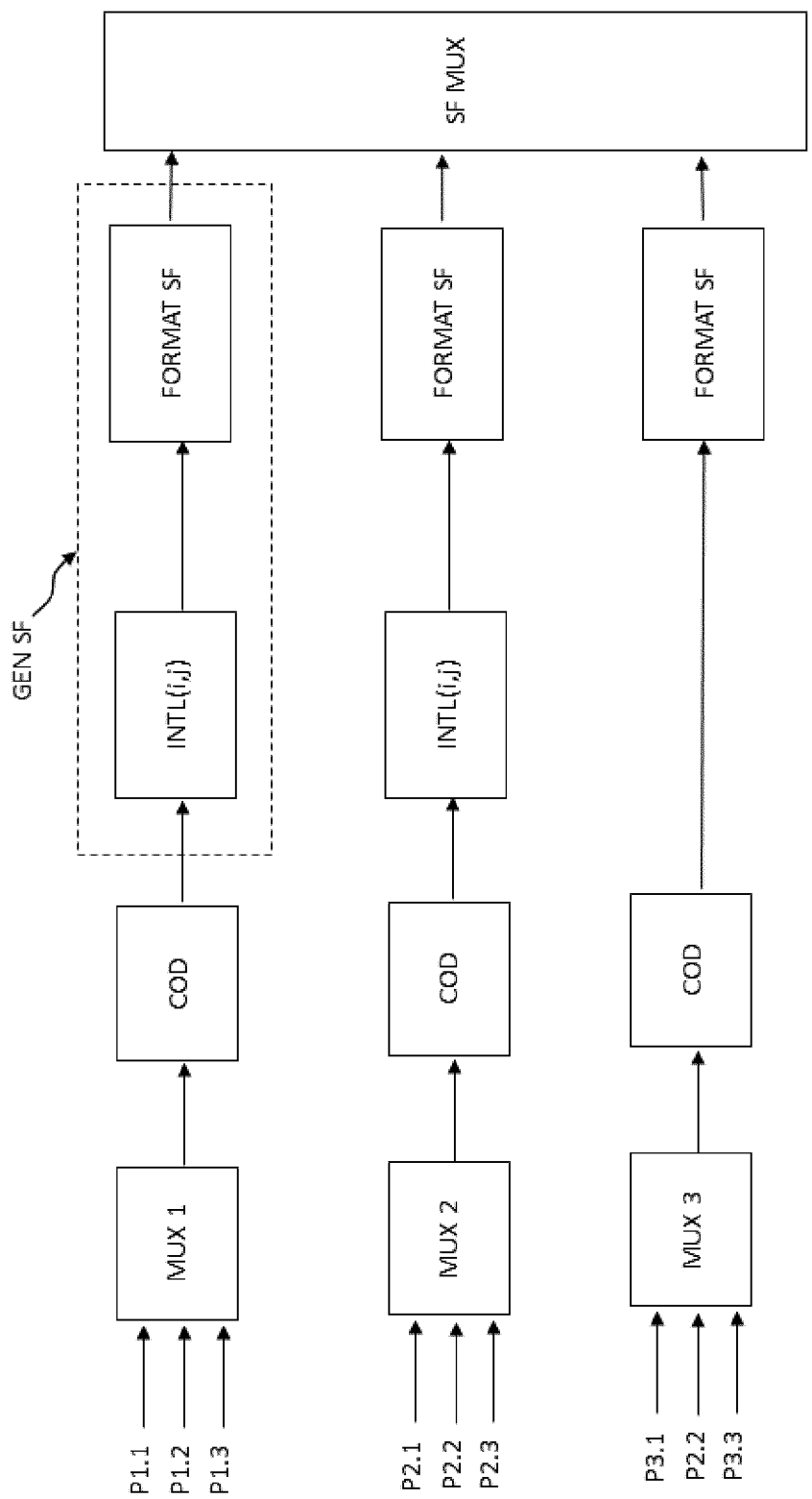
FIG. 2 shows different multiplexed signal communications channels according to the invention.

The signal processing system 1 comprises a set of primary multiplexers MUXi of a plurality of programs data streams. A program data stream may be a MPEG encoded audio signal, a MPEG encoded video signal or other data streams, for example. FIG. 2 represents three primary multiplexers called $MUX_1$, $MUX_2$, $MUX_3$ of a plurality of programs data streams $P_{i,j}$, where i,j ε [1,N]. The program $P_{i,j}$ is associated to the primary multiplexer $MUX_i$. The integer "j" represents the number of a program $P_{i,j}$ multiplexed in the primary multiplexer $MUX_i$.

In others embodiments, the signal processing system 1 comprises another combination of primary multiplexers $MUX_i$.

Each data stream of a primary multiplexer $MUX_1$ is multiplexed in a final multiplexer SF MUX into "super frames" SF before the output of the signal processing system 1. The multiplexed signal is then transmitted to the antenna into one carrier.

Each primary multiplexer $MUX_i$ works parallel in asynchronous or synchronous ways. In one embodiment, each primary multiplexer comprises a configuration in which the bit rate of each primary multiplexer is substantially the same as the other primary multiplexers. That configuration ensures coordinating the framing of the super frames SF at the input of the final multiplexer SF MUX.

Each program data stream $P_{i,j}$ may be considered as a stream of bits which is multiplexed with other streams of bits of different programs data streams. At the receiver level, each reception comprises a de-multiplexing operation in order to recover the bits stream corresponding to a selected program, e.g. the program chosen by a user.

The size of a super frame SF is defined by the DVB-S2 standard. If the bitrate of a program data stream is low the data over a long time period has to be collected to fill one SF. This may result in a high jitter for the transmit time of the SF. The invention allows minimizing the jitter introduced by the framing of the signal processing system 1. The primary multiplexers $MUX_i$ ensure a sub-multiplexing function that allows balancing the bit rate in each primary multiplexer $MUX_i$. Each primary multiplexer $MUX_i$ has a bit rate which is calculated by summing the bit rates of each multiplexed program in the said primary multiplexer. That property may be used for allocating the different programs in a specific way into the different primary multiplexers MUXi. The main criteria of the assignment a program to a sub-multiplex is the target receive scenario. Typically programs targeting a certain receive scenario are combined into the same sub-multiplex. Programs which can be also received by mobile receivers are multiplexed to one stream whereas programs targeting mainly applications for parked cars or fixed terminals are assigned to another sub-multiplex. According to the receive scenario different transmission parameter may be required.

If different programs comprise a same transmission parameters setting, they may be dispatched in different primary multiplexers $MUX_i$.

Each primary multiplexer $MUX_i$ may be configured as follow:

Combining several programs to one primary multiplexer increases the data rate per primary multiplexer and ensures that the data are better distributed in time.

The variation of the bit rate of a primary multiplexer becomes lower, this ensures reducing the jitter resulting from the framing.

It is an advantage of the invention to combine different data programs in the generation of super frames SF in each primary multiplexer. The average bit rate of a super frame is balanced so that the bit rate at the final multiplexer SF_MUX allows reducing the jitter effect.

The component which allows dispatching the programs in a plurality of primary multiplexers $MUX_i$ leads to an optimized bit rate repartition configuration, especially when many low bit rate programs are processed. A low bit rate may be an audio broadcast channels or a low bit rate video program.

One problem is: if the bit rate is low and the frame length of the super frame SF is long the data would be transmitted in a few bursts only. This is sub-optimal in case of a blockage event. Accordingly, the configuration of the interleaving function of the invention may result of an optimized dynamic modification of the interleaver length and the interleaver profile. An interleaver entity may be considered for defining the best compromise between the bit rate configuration and the interleaving configuration.

The signal processing system of the invention may be configured for processing super frame by super frame, at the emitter level, for which service the next super frame emitted is dedicated. This configuration allows the treatment of a super frame by generating an appropriated header of the said super frame. The composition of the super frame with different data programs previously encoded allows managing the priority of some programs taking into account the bit rate of the said program. This configuration is especially recommended when data from services targeting a low latency are ready to be transmitted. Hence, these data can be inserted with high priority as next super frame. The less delay critical data are delayed by one super frame accordingly.

In one embodiment the bit rate of a primary multiplexer is about 2 Mbits/s and the bit rate of the final multiplexer is about 10 Mbits/s. In this example a primary multiplex may include 30 audio channels with typically 64 kbit/s each on average whereas another primary multiplex includes 5 video channels 400 kbit/sec each targeting portable or mobile receivers with reduced screen size. For each primary multiplex the other parameters (interleaver length, redundancy added by the FEC scheme modulation parameters and resulting margin) can be selected individually. The other primary multiplexes may be data service or video channels targeting DTH reception.

Coding Component

The signal processing system comprises a coding component COD allowing the encoding of the bits streams of each multiplexer $MUX_i$. In one example, the coding component is a FEC encoder. The code rate of a FEC scheme is the ratio of the bitrate of the input data stream to the bitrate of the encoded data stream. If the code rate is low the FEC scheme provides a higher protection level, hence many signal blockages can be tolerated. Whereas for high code rates only a few short blockages within a time span defined by the code word length and the interleaver length can be handled. For mobile applications typically low code rates are preferred. A low code rate may be defined, for example, by a code rate less than 0.5.

Figure 5:
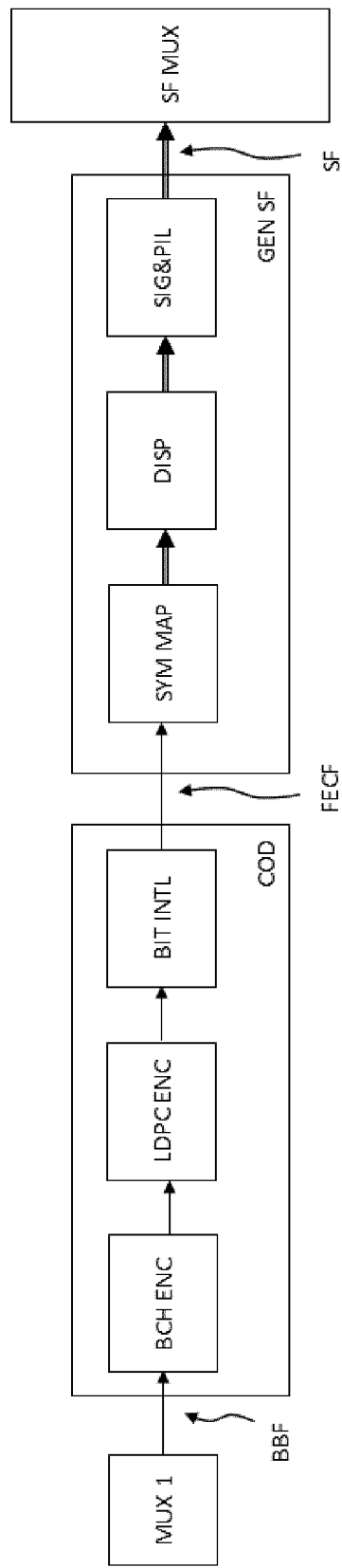
FIG. 5 shows the different functional entities of the signal processing system of the invention.

FIG. 5 illustrates a detailed implementation of one embodiment of the invention. In that example, the COD function comprises a first coding step BCH ENC, a second coding step LDPC ENC and a mixing step BIT INTL. The mixing step is a first interleaver function, known as a block interleaver and it deals with "intra-block interleaving". Typically a block is one or several code words as generated by the FEC encoder. In one embodiment of the invention the block is one LDPC code word as generated by a BCH and LDPC encoder compliant to the DVB-S2 standard.

In one embodiment, the coding component comprises an algorithm based on cyclic error correcting codes, known as BCH code. This code allows controlling the number of symbol errors correctable by the code.

In one embodiment, the coding component comprises a low density parity check coding algorithm, known as LDPC codes. This code allows transmitting information in a noisy transmission channel. It is a capacity approaching code technique.

In one embodiment of the invention, the BCH encoding scheme may be used with a LDPC encoding scheme in order to complete coding functions of the coding component COD.

In one embodiment, the coding component COD comprises a first interleaving function, also called "mixer". The first interleaving function "mixes" the order of the bits by considering a block of bits. Hence only the positions of the Bits within the block are changed. The mixing operation is processed block per block. This mixing operation does not support the mixing of bits from different blocks together.

The first interleaving function is noted BIT INTL in FIG. 5. This BIT INTL is a block interleaver. This function is integrated in the coding scheme of the signal processing system 1 of the invention, but it could also be integrated in a specific step after the coding operations.

It is the basic principle of a block interleaver that the elements of a data vector or matrix are permuted or exchanged within a block only. The interleaving operations are processed block per block depending on the size of the block consideration. It allows processing at a Bit level a mixing of Bits of a data stream encoded by the encoding functions. In one embodiment the structure of the BIT INTL is similar to the permutation process as proposed for DVB-SH and is described by:

Assuming the bit vector after FEC encoding (block length is 64800 bits) is defined by $$A=(a_0,a_1,a_2,\ldots,a_{64799})$$

The output of the BIT INTL is $$B=(b_0,b_1,b_2,\ldots,b_{64799})$$

with $$b_w=a_{(247*w \bmod 64800)}$$

Example: The input sequence
0 1 2 3 4 5 6 7 8 9 10 . . . 64797 64798 64799
is resorted to
0 247 494 741 988 1235 1482 . . . 63565 63812 64059 64306 64553

In others embodiments, the block interleaving processing may be carried out by one or more code words or using instead of the modulo operation a matrix interleaver.

The block size is defined by the block generated by the coding component COD. The first interleaving function changes the order of the bits in a code-word output from the FEC encoder. The mixing operation from the first interleaving function allows reducing frame saturation and improving memory optimization when an LDPC code is performed by the coding component.

At the output level of the coding component COD, FEC frames FECF are generated and are transmitted to the GEN SF component which allows forming super frames.

Super Frames Generator

The system of the invention comprises a super frames generator, also called GEN SF component, comprising a second interleaving function. The super frames generator comprises also a symbol mapping function.

The GEN SF component insures receiving a bits stream at his input level and generating a sequence of super frames SF at his output level. Each super frame SF comprises a set of interleaved symbols.

At least, three functions allow the processing operations of the super frame generator:
A symbol mapping function;
A disperser, also called the second interleaving function, and;
An assembler function.

Symbol Mapping Function

The super frame generator of the invention comprises a symbol mapping function SYM MAP which generates symbols by taking into account a bits stream at the input of the GEN SF component. The bits stream is treated by considering sets of bits. The size of each set of bits is defined by a predefined mapping scheme. The mapping scheme may be configured in function of a modulation order. Each set of bits considered by the SYM MAP function forms a symbol. Depending of the chosen modulation, each symbol may be encoded with a predefined number of bits. The way to make a symbol depends on the chosen digital modulation and the parameters of the modulation chosen.

For instance, the modulation scheme may be QPSK, an 8-PSK, a 16-APSK or a 16 QAM modulation. In others embodiments, others modulation schemes may be used in the invention.

Convolutional Interleaver

The second interleaver function is also called the disperser DISP. The disperser is configured with a predefined interleaving profile and an interleaver length. In one embodiment of the invention, the disperser is a convolutional interleaver which allows spreading data over several blocks of data. The second interleaving function is a time interleaving implemented at a physical layer. It allows recovering data lost by temporal signal blockages cause by obstacles like buildings, trees, bridges. The interleaver can also compensate variations of the signal strength caused by rain and/or non ideal antenna pointing.

The disperser DISP of the invention deals with these groups of symbols called capacity units CU in order to spread the data over several super frames.

FIG. 4 shows an example of a second interleaver function of the invention which is a convolutional interleaver.

Convolution interleavers deal with "inter-block interleaving", i.e., the data of one block are spread over several blocks, for instance several successive blocks. Hence, the data are mixed over a longer period than the mixer, also called previously the first interleaving function. The spreading of the interleaved data in a long period allows recovering data losses when a signal interruption has occurred during a long period.

The effective spreading time of the interleaver depends on the parameters selected for the super frame multiplexing and the length of the delay lines depicted in FIG. 4. For an efficient implementation, the period of the de-multiplexer, also called the dispatcher, and multiplexer shown in FIG. 4 is synchronized with the length of the super frame. "Synchronization" means that the super frame length is an integer multiple of the number of delay lines shown in FIG. 4 and the de-multiplexer and multiplexer is always at the same position for the first CU of a super frame. The spreading time limit may be defined as a predefined threshold in the configuration of the interleaver length. The parameters used for the disperser, such as the length of delay lines, etc., can be added to the header of the super frame to automatically configure the reception stage.

In another embodiment, the super frame structure is de-correlated from the interleaver parameter. In this case an additional synchronization method must be provided. In this case, the de-interleaving operation is independent from the decoding operation of super frames at the receiver level.

In one embodiment, the method of the invention allows interleaving data in a time window of a predefined duration, as for instance 30 s. The configuration of the length of the delay line in FIG. 4 may be selected depending on a specific use case. The size of a CU is an integer multiple of the number of bits mapped to one symbol. In one embodiment, a capacity unit size is chosen in order to be compliant with the DVB S2X protocol. The delay lines of FIG. 4 are set by considering a plurality of memory locations in which the capacity unit CU is spread. Each memory location works as a buffer for storing the data to transmit. Each memory location is fulfilled step by step by considering the next capacity unit CU that should be allocated. The dispatching of capacity units CU over a plurality of memory locations in a circular way allows spreading the data over a long period and minimizing the latency due to the time of processing the data.

The operation of interleaving symbols is implemented by taking into account an interleaver length and an interleaver profile which allows defining an interleaver entity. In one embodiment, as previously defined, the size of an interleaver entity may be independent from the super frame size. At the reception level, the operation of decoding a super frame is processing during the operation of extracting the data indicating the interleaver profile and the interleaver length emitted in the header of the super frame SF. Hence, according to the invention, the receiver is able to deal with the de-interleaving operation after decoding the super frame. It allows an ad hoc implementation of the invention for mobile receivers and fixed receivers. This configuration allows managing a super frame generation integrated an interleaving process for mobile receivers and managing a super frame generation without interleaving process for fixed receivers. Each receiver is able to deal with the presence of the interleaver profile at the decoding stage of a super frame.

A convolution interleaver may recovers data loss in longer period than a mixer which simply interleaves data in one Block, i.e., in smaller duration. One Block is first split into a set of CU. The CUs are dispatched to the delay lines. At the output of the delay line the CUs are again multiplexed to a Block. The interleaver length does not depend on the block size, but on the length of the delay lines and the transmission rate of the super frames for each sub-multiplex. The architecture and the design of a convolution interleaver depend on the way we expect to recover data loss on a certain duration.

The disperser DISP is synchronized to the super-frame structure. The super frame may comprise a set of blocks, a block may be considered as a bundled frame. The interleaver entity may be spread over different super frames. At the receiver level, that architecture allows de-interleaving symbols after gathering data decoding from a plurality of super frames. That architecture allows minimizing the latency of the transmission of data and ensures an optimized spreading of the symbols in a long period, several seconds to even minutes.

In one embodiment of the invention, the bundled frame comprises a sequence of capacity unit CU. This structure provides a grid for mapping the content into each superframe. The resource allocation grid is based on CU decomposition. In one embodiment the CU size can be set to 90 symbols. In others embodiments, the size of a capacity unit CU may be adapted on different cases. The scheme/grid based on capacity unit CU decomposition allows organizing a step of multiplexing by forming a super frame in a plurality of cycles in which a number of capacity unit are gathered and dispatched over a predefined period. A physical memory may be set to the resources needed in such a way that the saturation is avoided.

The capacity unit CU is a common entity to the super frame structure and the interleaver entity. It allows defining different configurations of composition of interleaver entities depending on the super frame structure.

A specific configuration of one embodiment of the invention may be the following one:
The super frame includes 9 payload frames of 64800 symbols each;
The length of a capacity unit CU is 90 symbols
The 64800 symbols are considered as sequence of 720 capacity units (720*90=64800).

One advantage of such configuration is that the interleaver parameters are independent from the modulation order. The interleaver works on symbol basis.

One another advantage is that the disperser is implemented by delay lines which allow establishing a compromise between the interleaving performance in order to limit data losses on a long period and the reduction of the latency of data transmissions.

In one implementation, the symbol mapping function is configured for distribution of partial data stream in a way of groups of symbols in each capacity units CU. The symbols are set depending on the modulation scheme. Each partial data stream is then delayed via delay lines, for instance which is implemented via FIFOs. The length of the delay lines may be regularly stepped. Any arrangements may be chosen, however, so that successive symbols lie as far apart as possible and the channel properties therefore are uncorrelated.

The Assembler Function

This function is ensured by the super frame generator which delivers super frames at his output level. The super frame structure comprises a format including different parts each corresponding to a specific field. A first field is a SOSF field, meaning: "Start-of-Super-Frame preamble". The format is described in the standard document ETSI EN 302 307-2 for Digital video broadcasting protocol. This protocol describes one example of a framing structure for multiplexed data for broadband satellite applications. In this example, the SOSF field allows improving synchronization mechanism at the receiver level when a super frame should de-framing. In one example the SOSF field comprises 270 symbols.

A second field called SFFI, meaning "Super-Frame Format Indicator", is used to indicate the identifier of the format of the super frame that is generated. This indicator may include the name of the DVB protocol used or the size of the payload following the headers fields of the super frame, or a specific tracking option or any option which may precise the protocol that is used. In one embodiment, the SFFI field may indicate the presence or not of interleaved data. For super frames intended exclusively for fixed receivers, this indication may be set to "no interleaved data". For super frames intended also for mobile receivers, this field may indicate the presence of interleaved data in the payload of the super frame.

The invention proposes defining a new field in the generation of super frame SF, called MFH field. This field allows including the definition of additional parameters related to the interleaving parameters. In one embodiment, the MFH field includes the interleaver length, the interleaver profile and a code rate. In one embodiment, this field is analyzed when the SFFI field of the super frame indicates the presence of interleaved data.

This field allows defining specific data for mobile receivers. The interleaving profile may be adapted to different use cases which implies different configurations.

One advantage is that invention allows combining super frames dedicated for fixed receivers and super frames dedicated for mobile receivers. The mobile receivers may decode at the reception level the header of a super frame received which includes the information provided in the SFFI and the MFH fields.

Another advantage of the MFH field, is that it allows the deployment of a ad hoc broadcasting protocol for mobile receivers. At the reception of a signal, a mobile receiver decodes, after de-multiplexing the carrier, the headers of a super frame. If the super frame is dedicated to a mobile receiver an interleaver profile and an interleaver length are decoded. That configuration is used for de-interleaving the data received in different super frames by considering the interleaver entity. A mobile receiver is able to process dynamically the interleaved data without knowing beforehand the interleaving scheme that is used by the emitter. The interleaving scheme is automatically and dynamically analyzed at the receiver level.

The managing of the data describing the interleaver profile, the interleaver length and the indication of presence of interleaved data in the payload of the super frame may be considered as signaling operations when the super frame is generated. At the emitter level, a signaling data insertion function may be used of managing these data. At the receiver level, a synchronization indicator and a signaling data extraction function may be used to ensure analyzing the interleaver configuration extracted from the header of a super frame. A computer and a memory may ensure these functions at the receiver level and the emitter level.

Synchronization

For synchronization of the convolution de-interleaver in the receiver, only the de-multiplexer needs to be synchronized. The synchronization scheme may only be based on the super frames structure. Hence, the operation of de-interleaving is independent from the synchronization requirement.

Method for Generating Data

At the emission level the method for generating interleaved super frames comprises:
Dispatching different program data in a plurality of primary multiplexers, the repartition of the program data being configured for balancing the bit rate of the data stream in each primary multiplexers.
Encoding the data stream in each primary multiplexer, the encoding step delivering encoded frames;
Optionally mixing at bits level each bits of a block of bits, as for instance the bits of one encoded frame or the bits of a set of encoded frames;
Generating symbols by taking into account a modulation scheme gathering bits into symbols
Dispersing symbols into different blocks of symbols by applying a interleaving scheme defining by an interleaver length and an interleaver profile. The operation of dispersing leading to the consideration of an interleaver entity. Each block of bits comprising a set of capacity units of a fixed number of symbols;
Generating super frames comprising signaling data and interleaved symbols;
Multiplexing super frames of different primary multiplexers ensuring an optimization of the bit rate at the output of a final multiplexer.

The load balancing scheme may be ensured by a load balancing system. This system may be configured so as to minimize jitter effects and/or to ensure a output bitrate substantially equal in each sub-multiplexer.

Method for Receiving Data

At the reception level the method for receiving interleaved super frames comprises:
De-multiplexing the data of carrier received at the receiver level;
Gathering super frames received and analyzing the signaling data for detecting super frames dedicated for mobile receivers;
Processing an operation of decoding super frames and gathering the data in interleaver entity according to the interleaver profile and the interleaver length
Processing an operation of de-interleaving the interleaver entity and gathering the data to be decoded.
Decoding data by applying the decoding scheme and the de-mixing scheme at the receiver level;
Recovering the data program and generating the media frame to the equipment dedicated to the treatment of such frames.

The invention claimed is:

1. Method of generating interleaved symbols in a multiplexed data steam for a satellite broadcasting application to a plurality of receivers, comprising:
allocating a plurality of data programs to a plurality of first multiplexers according to a load balancing scheme;
encoding in each first multiplexer a plurality of data programs according to a coding scheme at a predefined code rate for generating encoded frames;

generating super frames in each first multiplexer by:
performing symbols generation by applying a symbol mapping function to the previously encoded frames;
time interleaving symbols according to a convolutional interleaving scheme by:
dispersing a predefined number of symbols by considering blocks of symbols corresponding to capacity unit, into a sliding time window, the length of the time window being defined by an interleaver length;
generating at least a header for each super frame comprising a synchronization indicator, an indicator of the format of the super frame defining if said super frame includes interleaved or non-interleaved data and a reserved field indicating the value of transmit parameters, wherein the transmit parameters comprise at least an interleaver profile and/or an interleaver length;
generating a plurality of payload frames that each include a predefined number of capacity units, each super frame comprising interleaved symbols distributed over the plurality of payload frames;
multiplexing in a final multiplexer a set of super frames issued from the plurality of first multiplexers into a carrier signal.

2. The method according to claim 1, wherein the load balancing scheme ensures the same bit rate at the output of each first multiplexer, the load balancing scheme distributing data programs in the different first multiplexers taking into account each program bit rate.

3. The method according to claim 1, wherein the FEC scheme comprises a LDPC coder with or without additional BCH coder.

4. The method according to claim 3, wherein the FEC scheme comprises a mixer interleaving encoded bits of the multiplexed data programs, the mixing operation being realized by separating the encoded bits stream into blocks of bits and mixing bits inside each block.

5. The method according to claim 1, wherein the header of the super frame comprises an identifier field indicating the presence or not of time interleaved data in the payload of the said super frame.

6. The method according to claim 1, wherein the reserved field indicates the code rate of the FEC scheme.

7. The method according to claim 1, wherein the interleaver profile comprises:
a length of capacity unit;
a number of capacity units used in the interleaving process.

8. The method according to claim 1, wherein the super frames generated by a first multiplexer share the same interleaver profile, the load balancing scheme taking into account the interleaver profile in the programs distribution in each first multiplexer.

9. The method according to claim 1, wherein the interleaver length defines an interleaver entity and the size of the time window.

10. The method according to claim 1, wherein the interleaver length is equal or greater than the super frame length.

11. The method according to claim 1, wherein the header of the super frame comprises an synchronization field indicating the beginning of a super frame.

12. The method according to claim 11, wherein the dispersing operation is synchronized with the synchronization field.

13. The method according to claim 1, wherein the carrier signal is generated into one of the following band: Ka-band, Ku-Band, L-band, C-band or S-band.

14. Receiver for receiving a carrier signal multiplexed by the method of claim 1, wherein the receiver comprises a calculator for de-multiplexing the carrier signal, analyzing each header of the received super frames and de-interleaving the symbols of the payload of at least one super frame by applying the transmit parameters of the header related to the interleaver length and the interleaver profile.

15. The receiver according to claim 14, further comprising a calculator for:
extracting the interleaver length of a received super frame;
reserving a memory capacity of the receiver corresponding to the interleaver length for storing the received symbols of at least one decoded super frame, the data stored forming an interleaver entity;
de-interleaving the symbols of the interleaver entity.

16. Signal processing system for generating interleaved symbols for a satellite broadcasting application, wherein it comprises a plurality of first multiplexers, a load balancing system configured for allocating data programs in the different first multiplexers so that the output bit rates of each first multiplexer occupies several super frames in a time period according to the effective time interleaver length, each first multiplexer comprising a primary calculator for processing the following steps:
encoding and mixing bits of a multiplexed data stream and;
generating symbols by applying a symbol mapping function to the previous encoded frames, the symbol mapping function being stored in a physical memory of the signal processing system;
processing time interleaving symbols with a predefined interleaver profile and with an interleaver length;
generating super frames by:
inserting signaling data comprising the indication or not of interleaved data in the payload of each super frame;
generating a plurality of payload frames that each include a predefined number of blocks of symbols, each super frame comprising interleaved symbols distributed over the plurality of payload frames,
each first multiplexer comprising a primary physical memory for storing a set of symbols which are temporally stored in a convolutional interleaving processing, the physical memory being organized in a set of registers allowing spreading the symbols over a sliding time window, the system comprising a final multiplexer for multiplexing the super frames generated in each first multiplexer.

* * * * *